US008710507B2

(12) United States Patent
Tanabe

(10) Patent No.: US 8,710,507 B2
(45) Date of Patent: *Apr. 29, 2014

(54) SEMICONDUCTOR THIN FILM, THIN FILM TRANSISTOR, METHOD FOR MANUFACTURING SAME, AND MANUFACTURING EQUIPMENT OF SEMICONDUCTOR THIN FILM

(71) Applicant: Getner Foundation LLC, Dover, DE (US)

(72) Inventor: Hiroshi Tanabe, Tokyo (JP)

(73) Assignee: Getner Foundation LLC, Dover, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/761,585

(22) Filed: Feb. 7, 2013

(65) Prior Publication Data

US 2013/0146883 A1    Jun. 13, 2013

Related U.S. Application Data

(60) Continuation of application No. 13/359,406, filed on Jan. 26, 2012, now Pat. No. 8,377,805, which is a continuation of application No. 12/609,786, filed on Oct. 30, 2009, now Pat. No. 8,118,937, which is a division of application No. 11/387,709, filed on Mar. 24, 2006, now Pat. No. 7,635,894, which is a division of application No. 10/838,368, filed on May 5, 2004, now Pat. No. 7,049,184.

(30) Foreign Application Priority Data

May 9, 2003  (JP) ................................ 2003-131405

(51) Int. Cl.
*H01L 29/10*    (2006.01)

(52) U.S. Cl.
USPC ........................... 257/66; 219/121.6; 118/715

(58) Field of Classification Search
USPC ........................... 257/66; 219/121.6; 118/715
See application file for complete search history.

(56) References Cited

U.S. PATENT DOCUMENTS 5,946,561 A    8/1999  Yamazaki et al.
6,388,386 B1 *  5/2002  Kunii et al. ................. 315/169.3
(Continued)

FOREIGN PATENT DOCUMENTS

JP    Hei-7-118443 B    12/1995
JP    08-083766 A    3/1996
(Continued)

OTHER PUBLICATIONS

R.F. Woods, et al., "Semiconductors and Semimetal," Pulsed Laser Processing of Semiconductors, 1984, vol. 23, Academic Press, Inc.

(Continued)

*Primary Examiner* — Telly Green
*Assistant Examiner* — Paul Patton
(74) *Attorney, Agent, or Firm* — Amin, Turocy & Watson, LLP

(57) ABSTRACT

A method for manufacturing a semiconductor thin film is provided which can form its crystal grains having a uniform direction of crystal growth and being large in size and a manufacturing equipment using the above method, and a method for manufacturing a thin film transistor. In the above method, by applying an energy beam partially intercepted by a light shielding element, melt and re-crystallization occur with a light-shielded region as a starting point. The irradiation of the beam gives energy to the light-shielded region of the silicon thin film so that melt and re-crystallization occur with the light-shielded region as the starting point and so that a local temperature gradient in the light-shielded region is made to be 1200° C./μm or more. In the manufacturing method, a resolution of an optical system used to apply the energy beam is preferably 4 μm or less.

20 Claims, 11 Drawing Sheets

(56) References Cited

U.S. PATENT DOCUMENTS

| | | |
|---|---|---|
| 6,809,013 B2 | 10/2004 | Ito |
| 7,105,419 B2 | 9/2006 | Hiramatsu et al. |
| 7,294,538 B2 * | 11/2007 | Kim et al. .................... 438/166 |
| 7,364,952 B2 | 4/2008 | Im |
| 2004/0063258 A1 | 4/2004 | Kasahara et al. |

FOREIGN PATENT DOCUMENTS

| | | |
|---|---|---|
| JP | Hei-11-064883 | 3/1999 |
| JP | Hei2000-306859 A | 11/2000 |
| JP | 2001-028440 | 1/2001 |
| JP | 2004-119919 A | 4/2004 |

OTHER PUBLICATIONS

Office Action dated May 12, 2011 for U.S. Appl. No. 12/609,786, 16 pages.
Office Action dated Apr. 18, 2008 for U.S. Appl. No. 11/387,709, 8 pages.
Notice of Allowance dated Dec. 30, 2005 for U.S. Appl. No. 10/838,368, 11 pages.
Office Action dated May 29, 2012 for U.S. Appl. No. 13/359,406, 19 pages.

* cited by examiner

20 intensity profile
of end of beam

Light-intercepting pitch:1.5μm | Light-intercepting pitch:2.5 | 3.0 | 3.5

SEMICONDUCTOR THIN FILM, THIN FILM TRANSISTOR, METHOD FOR MANUFACTURING SAME, AND MANUFACTURING EQUIPMENT OF SEMICONDUCTOR THIN FILM

CROSS REFERENCE TO RELATED APPLICATIONS

This application is a Continuation of application Ser. No. 13/359,406, filed Jan. 26, 2012, which is a Continuation of application Ser. No. 12/609,786, filed Oct. 30, 2009, which is a Divisional of application Ser. No. 11/387,709, filed Mar. 24, 2006, which in turn is a Divisional of application Ser. No. 10/838,368, filed May 5, 2004, which claims priority to Japanese Patent Application No. 2003/131405 filed May 9, 2003, entitled SEMICONDUCTOR THIN FILM, THIN FILM, TRANSISTOR, METHOD FOR MANUFACTURING SAME, AND MANUFACTURING EQUIPMENT OF SEMICONDUCTOR THIN FILM, the entire disclosure of all of the above applications are incorporated by reference herein.

BACKGROUND OF THE INVENTION

1. Field of the Invention

The present invention relates to a method for manufacturing a semiconductor thin film making up a semiconductor device, such as memory and CPU (Central Processing Unit), a thin film transistor (TFT) made up of a same semiconductor thin film, and a method for manufacturing the same semiconductor thin film and the same TFT (and a manufacturing equipment being used in manufacturing the same semiconductor thin film.

2. Description of the Related Art

A conventional product manufactured by forming a semiconductor integrated circuit on a glass substrate is typified by a TFT. A conventional typical TFT is constructed, as shown in FIG. 17, by forming a channel region 103, a source region 104, a drain region 105, and an LDD (Lightly-doped drain) region 106 on a glass substrate 101 coated with a substrate coating layer 102, and then by forming a gate electrode 108 with a gate insulating film 107 being interposed between the gate electrode 108 and such the regions 103, 104, 105, and 106 as above, and by forming a contact hole in deposited silicon dioxide 109, and further by being wired using a metal 110.

A TFT being generally and presently used is classified depending on its active layer and a hydrogenated amorphous silicon TFT and poly-crystalline silicon TFT have come into wide use. A maximum temperature being employed in a process of fabricating the hydrogenated amorphous silicon TFT is about 300° C., which has achieved carrier mobility of about 1 cm$^2$/Vsec. On the other hand, in the case of the poly-crystalline silicon TFT, by using, for example, a quartz substrate and by performing a high-temperature process of about 1000° C., a poly-crystalline silicon thin film having crystal grains being large in size is formed in which carrier mobility of about 30 to 100 cm$^2$/Vsec has been achieved. However, the poly-crystalline silicon TFT has a disadvantage. That is, since the high-temperature process of about 1000° C. is performed when the poly-crystalline silicon is manufactured, a low-priced glass having a low-softening point cannot be used, unlike in the case of the hydrogenated amorphous silicon TFT.

To solve this problem, formation of a poly-crystalline thin film at low temperatures by using laser crystallization technology is being studied and developed. Laser crystallization technology is disclosed in, for example, Japanese Patent Publication No. Hei 7-118443 in which an amorphous silicon thin film (also being called an a-Si thin film) deposited on an amorphous substrate is crystallized by being irradiated with a short wavelength laser and which is applied to manufacturing of a TFT being excellent in a charge mobility characteristic. This laser crystallization technology has an advantage in that, since the technology enables crystallization of an amorphous silicon without elevating a temperature of an entire substrate, formation of a semiconductor device and/or a semiconductor integrated circuit on such a large-area substrate as a liquid crystal display or a like and such a low-priced substrate as glass or a like is made possible.

Moreover, a method is disclosed in Japanese Patent Application Laid-open Nos. Hei 11-64883 and 2000-306859 in which a poly-crystalline silicon thin film (also called poly-Si thin film) having crystal grains being larger in size is formed to manufacture a semiconductor thin film being excellent in a charge mobility characteristic.

For example, in the method disclosed in the Japanese Patent Application Laid-open No. Hei 11-64883, an amorphous silicon thin film is irradiated with an excimer laser beam to melt and re-crystallize it and to form a silicon crystal having grains being large in size. In the method disclosed in the Japanese Patent Application Laid-open No. 2000-306859, by irradiating an energy beam sequentially in a manner in which a location to be irradiated with the energy beam is shifted, a poly-crystalline semiconductor thin film is grown, that is, more specifically, while a laser is irradiated two or more times in a scanning manner in a region where the amorphous silicon thin film is melted and re-crystallized, the location to be irradiated with the laser is shifted in order to form a silicon thin film having crystal grains being large in size. In each embodiment disclosed in the Japanese Patent Application Laid-open No. Hei-64883, an aperture width (1 μm to 2 μm) is smaller than a width of a light-shielding mask pattern (1.5 μm to 5 μm) and an energy beam is irradiated through the aperture having the small width to melt the amorphous silicon thin film and the location to be irradiated with the laser is shifted to form a silicon thin film having crystal grains being large in size.

Furthermore, in the invention disclosed in the Japanese Patent Application Laid-open No. 2000-306859, as in the case of the invention disclosed in the Japanese Patent Application Laid-open No. Hei 11-64883, the amorphous silicon thin film is repeatedly irradiated with a laser while the region to be irradiated with the laser is shifted, little by little (for example, by 1 μm), within a range in which the amorphous silicon thin film is crystallized by one pulse irradiation with a laser. In the method employed in the above invention, a cyclical light and dark pattern in a light-shielded region is provided and a direction of crystallization is controlled by using a temperature gradient which changes depending on the light and dark pattern.

However, the technology disclosed in the Japanese Patent Application Laid-open No. Hei 11-64883 has a problem. That is, in the manufacturing method disclosed in the Japanese Patent Application Laid-open No. Hei 11-64883, the region where the amorphous silicon thin film is melt and re-crystallized is irradiated two or more times with a laser in a scanning manner and the location to be irradiated with the energy beam is shifted while being irradiated with the laser and, as a result, a difference between a width of a mask to intercept a laser and a width of an aperture to let the laser be transmitted is small, which causes much time to be taken in forming a silicon thin film having crystal grains being large in size.

Also, in the manufacturing method disclosed in the Japanese Patent Application Laid-open No. 2000-306859, while the amorphous silicon thin film is crystallized, the regions to be irradiated with a laser are sequentially shifted so that the regions irradiated with the laser are not overlapped to form the silicon thin film having crystal grains being large in size. However, since its movement distance is as short as about 1 µm, it takes much time to complete the processing in a specified region.

SUMMARY OF THE INVENTION

In view of the above, it is an object of the present invention to provide a method for manufacturing a semiconductor thin film which uses an energy beam irradiating technique that can form crystal grains having a uniform direction of growth of a crystal and being large in size and a manufacturing equipment using the above method. It is another object of the present invention to provide a method for manufacturing a TFT being made up of such the semiconductor thin film as manufactured by the above method. It is still another object of the present invention to provide a semiconductor thin film manufactured by the above method and the TFT manufactured by the above methods. It is still another object of the present invention to provide a manufacturing equipment of the semiconductor thin film that can form crystal grains having a uniform direction of growth of a crystal and being large in size.

According to a first aspect of the present invention, there is provided a method for manufacturing a semiconductor thin film including:

a step of causing a preformed semiconductor thin film to melt and re-crystallize with a light-shielded region therein as a starting point of its melt and re-crystallization, by irradiating the preformed semiconductor thin film with an energy beam partially intercepted by a light-shielding element;

wherein irradiation of the energy beam gives energy to the light-shielded region so that melt and re-crystallization occur with the light-shielded region as the starting point and so that a local temperature gradient in the light-shielded region is made to be 300° C./µm or more.

Thus, according to the present invention, since the energy beam is applied to the light-shielded region so that the local temperature gradient in the light-shielded region in the semiconductor thin film is made to be 300° C./µm or more, the temperature gradient serves as a driving force to make a crystal of the semiconductor thin film grow in a specified direction. Moreover, since the energy beam is applied to the light-shielded region in the semiconductor thin film to supply energy so that the light-shielded region becomes a starting point for the melt and re-crystallization, it is made possible to make a crystal of the semiconductor thin film grow by the above temperature gradient in a specified direction with the light-shielded region as the starting point. As a result, since growth of a crystal occurs by the melt and re-crystallization from the starting point in a direction of the temperature gradient, the semiconductor thin film whose crystal grains having a uniform direction of crystal growth and being large in size can be formed effectively in a very short time.

In the foregoing, a preferable mode is one wherein a resolution of an optical system used to irradiate the energy beam is 4 µm or less.

Thus, according to the present invention, since the resolution of the optical system used to irradiate the energy beam is 4 µm or less, the above temperature gradient in a size of 4 µm or less can be provided. As a result, the temperature gradient serving as the driving force to make a crystal grow from the starting point in a specified direction can be realized.

Also, a preferable mode is one wherein the temperature gradient is provided by an intensity gradient of an energy beam with 220 mJ/cm$^2$/µm or more having reached the light-shielded region.

Thus, according to the present invention, the energy beam partially intercepted by the light-shielding element diffracts (turns around) the light-shielded region to heat the semiconductor thin film and by the intensity gradient of the energy beam with 220 mJ/cm$^2$/µm or more having reached the light-shielded region, the above temperature gradient serving as the driving force to make a crystal grow in a specified direction is realized.

Also, a preferable mode is one wherein at least two-directional temperature gradient is provided in the light-shielded region.

Thus, according to the present invention, when the energy beam is irradiated in a manner in which it diffracts (turns around) the light-shielded region, since at least two-directional temperature gradient can be provided in the light-shielded region, a driving force is given which causes the crystal to grow at least in two directions with the light-shielded region as the starting point.

Also, a preferable mode is one wherein the light-shielding element is a light-shielding mask obtained by forming a light-shielding pattern on a transparent substrate.

Also, a preferable mode is one wherein, by one pulse applying an energy beam to the light-shielding elements on which the light-shielding patterns are periodically arranged to melt and re-crystallize an entire surface of the semiconductor thin film.

Thus, according to the present invention, since the entire surface of the semiconductor thin film can be melted and re-crystallized by one pulse irradiation with the energy beam by using the light-shielding elements on which the light-shielding patterns are periodically arranged, crystallization of a semi-conductor thin film whose crystal grains having a uniform direction of the crystal growth and being large in size can be performed very effectively.

Also, a preferable mode is one wherein a ratio (P/L) between a light-shielding width L of the light-shielding pattern and a pitch P of the light-shielding pattern is 1 (one) or more.

Thus, according to the present invention, since larger crystal growth driving force can be given by the above temperature gradient, even when the ratio (P/L) between the light-shielding width L of the light-shielding pattern and the pitch P of the light-shielding pattern is 1 (one) or more, a crystal being large enough to cover aperture portions among the light-shielding patterns can be grown. Even if the P/L ratio is as large as 10 or more, a crystal being large enough to cover the aperture portions among the light-shielding patterns can be grown, which is an effect that has not been acquired in the conventional technology.

Also, a preferable mode is one wherein a light-shielding width of the light-shielding pattern is 0.3 µm or more.

Thus, according to the present invention, since the local temperature gradient in the light-shielded region is 300° C./µm or more, the light-shielding width can be set at a lower limit value being as small as 0.3 µm.

Also, a preferable mode is one wherein the semiconductor thin film before being melted and re-crystallized is made from an amorphous silicon or a poly-crystalline silicon.

Thus, according to the first aspect of the present invention, the semiconductor thin film preformed before being melted and re-crystallized is made up of an amorphous silicon of which a melting point is 1150° C.) or a poly-crystalline silicon of which a melting point is 1410° C.

According to a second aspect of the present invention, there is provided a method for manufacturing a thin film transistor including:

a step of forming a crystallized film by making a crystal of a semiconductor thin film grow in one direction with a light-shielded region in the semiconductor thin film as a starting point by applying an energy beam to the semiconductor thin film using a gate electrode formed with a gate insulating film interposed between the gate electrode and the semiconductor thin film as an light-shielding element;

wherein irradiation of the energy beam gives energy to the light-shielded region so that melt and re-crystallization occur with the light-shielded region as the starting point and so that a local temperature gradient in the light-shielded region is made to be 300° C./µm or more.

Thus, according to the present invention, since, by using the gate electrode formed with the gate insulating film interposed between the gate electrode and the semiconductor thin film, the energy beam is applied to the light-shielded region so that the local temperature gradient in the light-shielded region in the semiconductor thin film is made to be 300° C./µm or more, the temperature gradient serves as a driving force to cause a crystal of the semiconductor thin film to grow in a specified direction. Moreover, since the energy beam is applied to the light-shielded region in the semiconductor thin film to supply energy so that the light-shielded region becomes a starting point for the melt and re-crystallization, it is made possible to form a crystallized film obtained by making a crystal of the semiconductor thin film grow by the above temperature gradient in a specified direction with the light-shielded region as the starting point. As a result, since growth of a crystal occurs by the melt and re-crystallization from the starting point in a direction of the temperature gradient, the semiconductor thin film whose crystal grains having a uniform direction of the crystal growth and being large in size can be formed effectively in a very short time.

In the foregoing, a preferable mode is one wherein the temperature gradient is provided by an intensity gradient of an energy beam with 220 mJ/cm²/µm or more having reached the light-shielded region.

Thus, according to the present invention, the energy beam partially intercepted by the gate electrode serving as the light-shielding element diffracts (turns around) the light-shielded region to heat the semiconductor thin film and by the intensity gradient of the energy beam with 220 mJ/cm²/µm or more having reached the light-shielded region, the above temperature gradient serving as the driving force to make a crystal grow in a specified direction is realized.

Also, a preferable mode is one wherein a width of the gate electrode is 0.3 µm or more.

Also, a preferable mode is one wherein the semiconductor thin film before being melted and re-crystallized is made from an amorphous silicon or a poly-crystalline silicon.

Thus, according to the present invention, a melting point of the amorphous silicon is 1150° C. and a melting point of the poly-crystalline silicon is 1410° C.

According to a third aspect of the present invention, there is provided a semiconductor thin film manufactured according to the method for manufacturing a semiconductor thin film stated in any one of Claim 1 to Claim 9, wherein a thickness of the starting point portion from which growth of the crystal of the semiconductor thin film having been melted and re-crystallized starts is smaller than a thickness of a terminating portion of growth of the crystal and growth of its crystal occurs in a direction of a thickness gradient.

In the foregoing, a preferable mode is one wherein a crystal of the semiconductor thin film grows from its starting point for the growth, at least, in two directions.

According to a fourth aspect of the present invention, there is provided a thin film transistor manufactured according to the method for a thin film transistor stated in Claim 10 to Claim 13, wherein a thickness of the starting point portion from which growth of the crystal of the semiconductor thin film having been melted and re-crystallized which makes up the thin film transistor starts is smaller than a thickness of a terminating portion of growth of the crystal and growth of its crystal occurs in a direction of the thickness gradient.

According to a fifth aspect of the present invention, there is provided a manufacturing equipment of a semiconductor thin film including:

a irradiation device to cause, by applying an energy beam to light-shielding elements each being arranged between a semiconductor thin film and an energy beam irradiating source, a crystal to grow in a desired direction with a light-shielded region of the semiconductor thin film as a starting point;

wherein the irradiation device has an optical system with a resolution of 4 µm or less.

Thus, with the fifth aspect of the present invention, since the manufacturing equipment is equipped with the irradiation device having the optical system with a resolution of 4 µm or less, the local temperature gradient which enables growth of the crystal to occur in a desired direction with the light-shielded region as the starting point can be given to the light-shielded region in which light is intercepted by the light-shielding element.

In the foregoing, a preferable mode is one wherein the light-shielding element is a light-shielding mask obtained by forming a light-shielding pattern on a transparent substrate and a ratio (P/L) between a light-shielding width L of the light-shielding pattern and a pitch P of the light-shielding pattern is 1 (one) or more.

Also, a preferable mode is one wherein a light-shielding width of the light-shielding pattern is 0.3 µm or more.

Furthermore, a preferable mode is one wherein the irradiation device has a projection exposure unit which enables melt and re-crystallization to occur on all surfaces of the semiconductor thin film by one pulse irradiation with an energy beam.

Thus, according to the present invention, since such the projection exposure unit as above is provided, the semiconductor thin film whose crystal grains having a uniform direction of crystal growth and being large in size can be formed effectively in a very short time.

With the above configurations, unlike in the conventional case in which several tens times to several hundreds times beam irradiation is required to re-crystallize a semiconductor thin film on a substrate having even a big area size of, for example, 1 m square, by one pulse irradiation, re-crystallization of the semiconductor thin film on an entire surface of a substrate can be realized. As a result, a process of irradiating a laser beam is speeded up several tens times to several hundreds times and a maintenance life of the energy beam irradiation device can be made very long.

With another configurations, since a big crystal can be grown in a specified direction, by matching a running direction of a carrier with a direction of growth of a crystal, unlike in the conventional method in which a channel is formed in a semiconductor thin film having polycrystalline grains arranged randomly, a high on-current with a high mobility can be obtained. As a result, an integrated circuit whose driving voltage is lower than that of an integrated circuit made up of thin film transistors formed on a glass substrate by the conventional method and whose operating speed is high can be achieved and, when the integrated circuit of the present invention is employed, for example, in a liquid crystal display, both a pixel TFT to drive each pixel and a peripheral driving circuit are simultaneously formed on a same glass substrate, which serves to enable manufacturing process costs to be reduced and peripheral driver integrated circuits to be miniaturized and enables creation of new electronic devices.

With still another configurations, since the irradiation device having an optical device with high resolution is provided, a local temperature gradient which enables growth of the crystal to occur in a desired direction with a light-shielded region as a starting point can be given to the light-shielded region in which light is intercepted by the light-shielding element. As a result, melt and re-crystallization of a semiconductor thin film can be very effectively performed. A remarkable effect, in particular, is that melt and re-crystallization can be achieved by one pulse irradiation even if a semiconductor thin film has a large area.

Additional effects are that, the semiconductor thin film an/or the TFT manufactured by the methods of the present invention can be used in functional devices such as a display, sensor, printing device, or a like and in semiconductor devices such as a memory, CPU (Central Processing Unit), or a like and, in particular, in a TFT (thin film transistor), SOI (Silicon on Insulator) transistor, and inverter formed on an insulator making up a semiconductor device or functional devices or electronic devices using them.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

A semiconductor thin film of the present invention is manufactured/completed by irradiating an energy beam on a preformed semiconductor thin film with direct-light-shielded regions (photo-masking regions) to melt and re-crystallize the preformed semiconductor thin film with its direct-light-shielded regions as starting points. More specifically, in the above method, by irradiating an excimer laser with a wavelength of 308 nm, using a mask projection method, on a silicon (Si) thin film, melt and re-crystallization is made to occur in the direct-light-shielded region of the silicon thin film being intercepted by a light-shielding pattern of the mask and growth of a silicon crystal occurs in a direction of a local temperature gradient with the portion where the melting and crystallization occurs as a starting point. The present invention is thus characterized in that the irradiation of the energy beam gives energy to the direct-light-shielded region in the silicon thin film so that melt and re-crystallization occurs with the direct-light-shielded region as the starting point and in that the local temperature gradient in the direct-light-intercepted portion is made to be 300° C./μm or more. In the present invention, the above temperature gradient acts as a large driving force to cause the crystal to grow from its starting point to a specified direction. The above melt and re-crystallization process causes a recrystal to grow from the starting point for occurrence of melt and re-crystallization to the direction of a temperature gradient and, as a result, crystal grains being large in size and having a uniform direction of its growth are formed. The method for manufacturing a semiconductor thin film of the present invention can be preferably applied to manufacturing of, for example, an amorphous silicon (a-Si) thin film, poly-silicon (poly-Si) thin film, or a like, which enables re-crystallization of the silicon thin film to occur so that the silicon thin film having crystal grains being large in size and having grown in a specified direction is produced.

First Embodiment

A Method for Manufacturing Semiconductor Thin Film

Figure 1A:
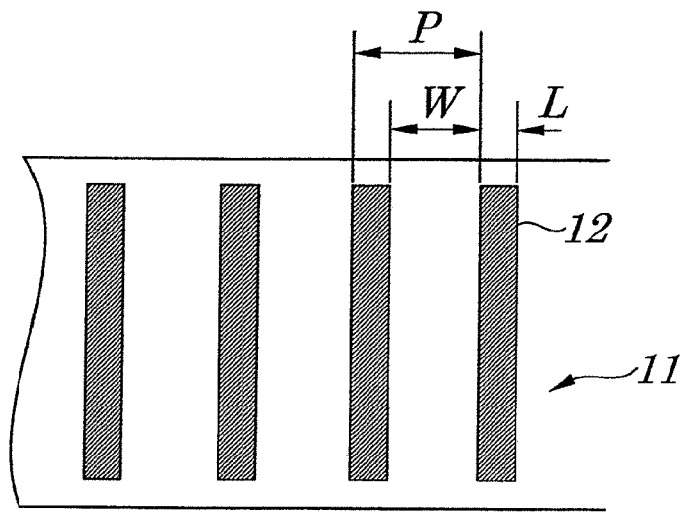
FIGS. 1A and 1B are diagrams explaining a method for manufacturing a semiconductor thin film according to a first embodiment of the present invention.
Figure 1B:
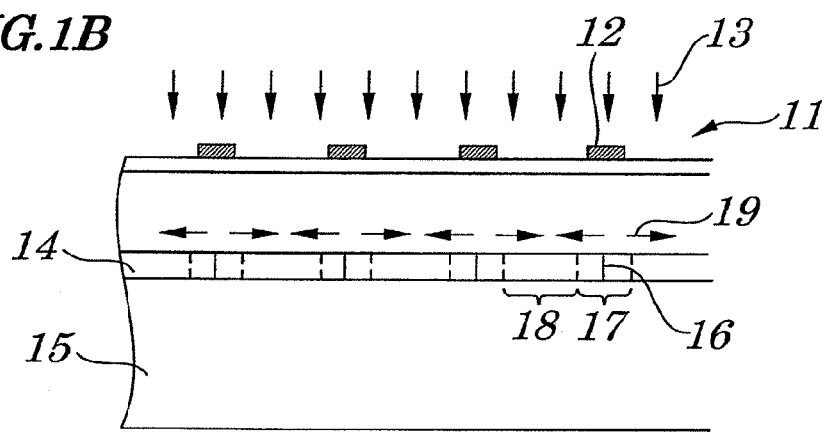
Figure 2:
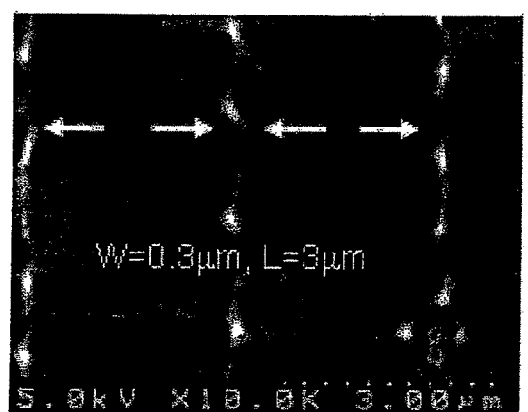
FIG. 2 shows a photograph of a magnified plan view of a growing state of a silicon crystal observed when melt and re-crystallization have occurred by using a light-shielding mask as shown in FIG. 1A according to the first embodiment of the present invention.
Figure 3A:
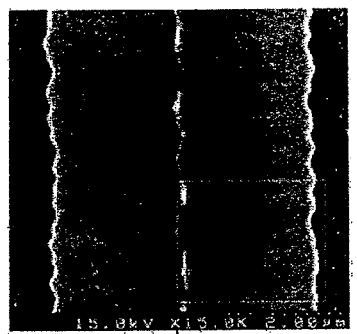
FIGS. 3A and 3B show photographs of a magnified plan view of a state of a crystal growing in the same direction as a temperature gradient direction (in a horizontal direction) according to the first embodiment of the present invention.
Figure 3B:
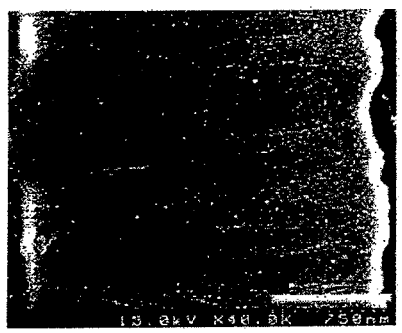

FIGS. 1A and 1B are diagrams explaining a method for manufacturing a semiconductor thin film according to a first embodiment of the present invention. FIG. 1A is a plan view illustrating one example of light-shielding elements employed in the present invention. FIG. 1B is a schematic cross-sectional view explaining melt and re-crystallization occurring in a semiconductor thin film irradiated with a beam employed in the present invention. FIG. 2 shows a photograph of a magnified plan view of a growth state of a silicon crystal observed when melt and re-crystallization have been performed by using the light-shielding mask as shown in FIG. 1A. FIGS. 3A and 3B show photographs of a magnified plan view of a state of a crystal growing in the same direction as a temperature gradient direction (in a horizontal direction).

The light-shielding elements are placed between a beam source and an object to be irradiated (in an upper portion of a semiconductor thin film 14 or above the semiconductor thin film 14) to intercept part of an energy beam 13 to be applied to the semiconductor thin film 14. As the light-shielding element, for example, a light-shielding mask formed on a glass substrate 15 (FIG. 1B) by patterning, or a like is employed. Moreover, as described later, in the case of manufacturing a TFT of the present invention, a gate electrode formed on a gate insulating film formed on a semiconductor thin film functions as a light-shielding element.

As shown in FIG. 1A, on a light-shielding mask 11 are arranged, at a specified pitch (interval) "P", stripe-shaped mask patterns 12 each having an aperture width "W" among them and each having a light-shielding width "L". An experiment employed in the present invention shows that, since, by using an optical system (to be described later) with high resolution, the temperature gradient in a direct-light-shielded region 17 (hereinafter may be referred to as light-shielded region 17) in the semiconductor thin film 14 is made to be 300° C./μm or more and, as shown in FIG. 1B, FIG. 2 and FIGS. 3A and 3B, a crystal was able to be grown by a large growth driving force in a direction of a local temperature gradient from a starting point 16 where growth of a crystal starts to occur. As a result, even if the light-shielding mask 11 having a narrow light-shielding width L, a large aperture width W, and a wide pitch P was used, a crystal of a semiconductor thin film was able to be grown in a manner in which an entire region including the starting point 16 of the light-shielded region 17 having the narrow width to the aperture portion 18 having the large width was filled with the crystal. Moreover, arrows 19 shown in FIG. 1B indicate a direction in which the crystal grows from each of the starting points 16 toward the adjacent light-shielded region 17. Each white vertical line 20 shown in FIG. 2 and FIGS. 3A and 3B indicate a portion in which a crystal grown from the light-shielded regions 17 being adjacent to one another struck one another and in which a crystal was growing in one direction (in a horizontal direction in FIG. 1B) in a manner in which the growth was directed toward the light-shielded regions 17 being adjacent to one another.

In the present invention, since the light-shielded region 17 in the semiconductor thin film 14 is made to have a temperature gradient, the light-shielding mask 11 having a P/L ratio (ratio of the pitch P to the light-shielding width L) being 1 or more, for example, being 10 or more can be also used. Even when a light-shielded region having a small light-shielded region width is formed on a semiconductor thin film by using the light-shielding mask, a large temperature gradient occurs in the light-shielded region and, as a result, a crystal of the semiconductor thin film can be grown in a direction of the temperature gradient. Moreover, the P/L ratio has its specified upper limit which is determined depending on intensity of an energy beam, resolution of an optical system, cooling state, or a like.

Figure 4A:
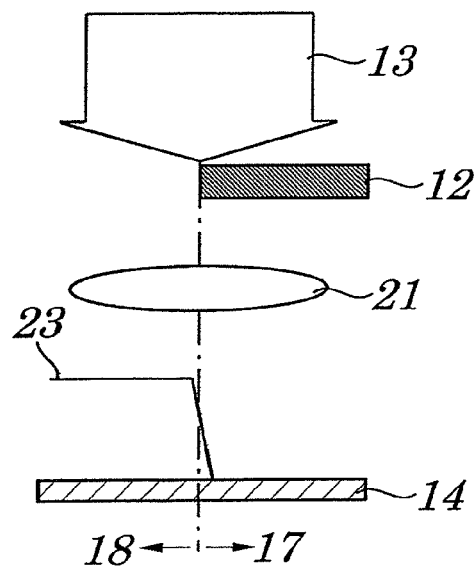
FIGS. 4A and 4B are schematic diagrams showing an intensity distribution of an energy beam obtained when an optical system having high resolution or low resolution is used according to the first embodiment of the present invention.
Figure 4B:
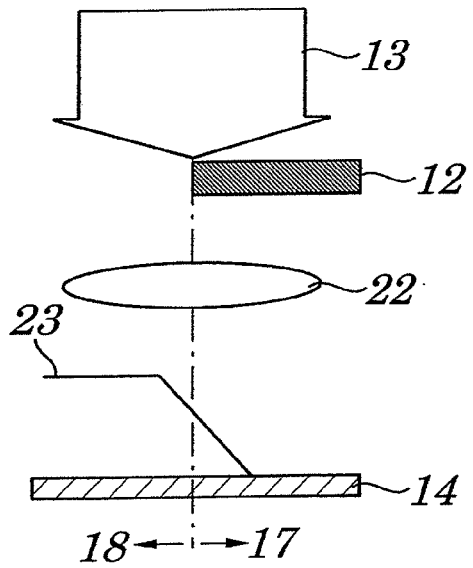
Figure 5:
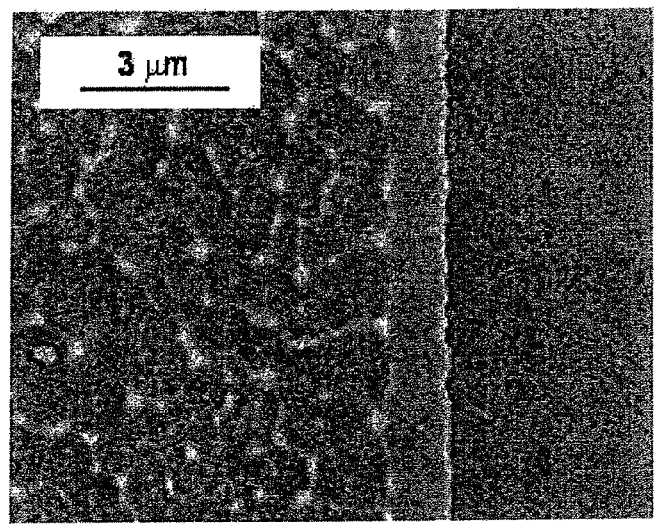
FIG. 5 is a diagram explaining an intensity gradient of an energy beam obtained when an optical system having high resolution is used and a magnified photo showing a state of growth of a crystal of semiconductor thin film which has occurred in the intensity gradient according to the first embodiment of the present invention.
Figure 5:
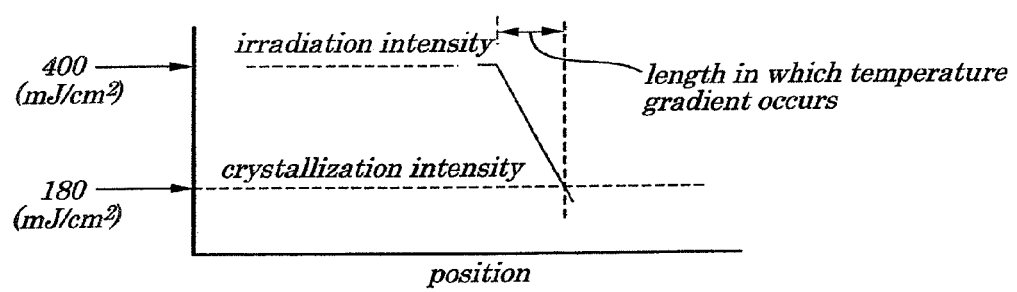
Figure 6:
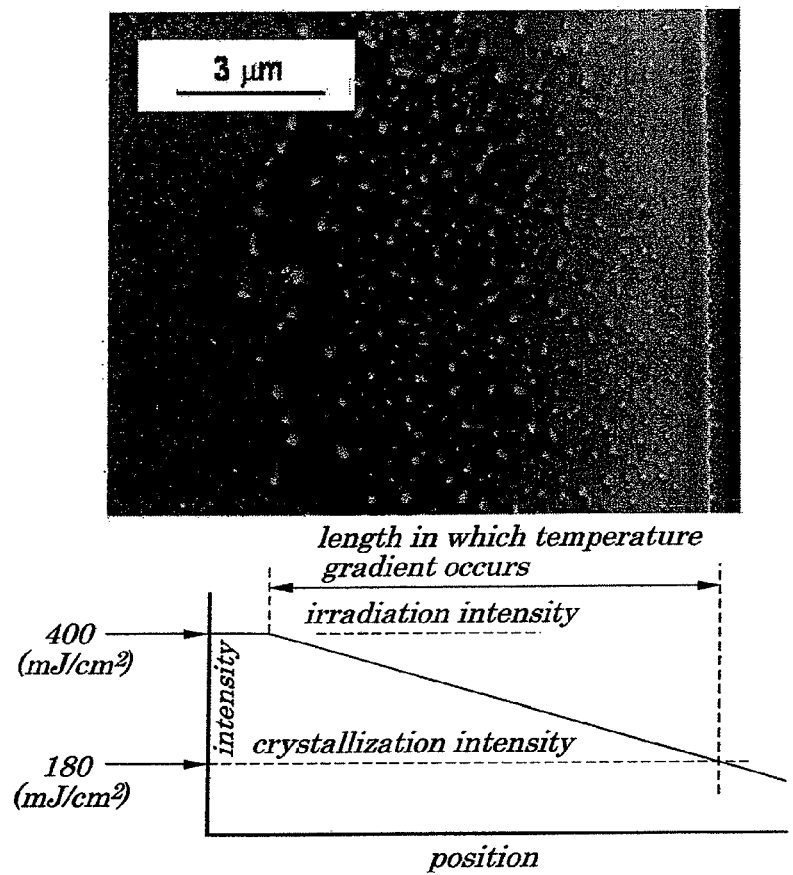
FIG. 6 is a diagram explaining an intensity gradient of an energy beam obtained when an optical system having resolution being different from that of the optical system shown in FIG. 5 is used and a magnified photo showing a state of growth of a crystal of a semiconductor thin film which has occurred in the intensity gradient according to the first embodiment of the present invention.

FIG. 4A is a schematic diagram showing an intensity distribution 23 of an energy beam 13 obtained when an optical system 21 having high resolution is used according to the present invention. FIG. 4B is a schematic diagram showing an intensity distribution 23 of an energy beam 13 obtained when an optical system 22 having low resolution is used according to the present invention. FIGS. 5 and 6 are diagrams explaining an intensity gradient of an energy beam obtained when optical systems each having different resolution are used and magnified photos showing states of growth of a crystal of semiconductor thin film which has occurred by the intensity gradient according to the present invention.

As the energy beam 13 that can be employed in the present invention, various energy beams each having specified output intensity can be used. For example, an excimer laser with a wavelength of 308 nm which has an output characteristic of 100 mJ/cm$^2$ to 1000 mJ/cm$^2$ can be preferably used. Moreover, the output characteristic of the energy beam is a parameter that can be varied depending on a diameter of a beam.

The energy beam 13 is applied by the optical system 21 with a resolution of 4 μm or less as shown in FIG. 4A to a surface of the semiconductor thin film 14. The resolution of the optical system can be calculated by using the equation: Resolution=(constant)×wavelength/number of apertures. Preferably, the optical system 21 is used which has the number of apertures (NA) of 0.2 using an excimer laser with a wavelength of 308 nm and has high resolution obtained by substituting a constant within 0.50 to 0.75 into the above equation. Moreover, the number of apertures (NA) is given by a following equation: NA=n sin θ, where "n" denotes a refractive index of a medium. Since n=1 in the air, NA=sin θ.

In the present invention, the energy beam 13, part of which is intercepted by the light-shielding element, diffracts (turns around) the light-intercepted portion 17 to heat the semiconductor thin film 14 and, by using the optical system 21 with such the high resolution, the light-shielded region 17 in the semiconductor thin film 14 can be made to have an intensity gradient of an energy beam of 220 mJ/cm$^2$/μm or more, for example. That is, by irradiating the semiconductor thin film 14 with an energy beam 13 using the high-resolution optical system 21 with a resolution of 4 μm or less, the light-shielded region 17 in the semiconductor thin film 14 can be made to have the above intensity gradient and, as a result, a temperature gradient of 300° C./μm or more can be realized. Moreover, an intensity gradient of the energy beam can be evaluated by irradiating a fluorescent plate with a beam and magnifying fluorescent light emitted from the fluorescent plate using a lens and then reading it by a CCD (Charge Coupled Device).

On the other hand, in the case of the optical system 22 as shown in FIG. 4B which has a resolution of about 10 μm or more, an intensity gradient of an energy beam is small and, as a result, unlike in the case of the present invention, it is impossible to realize a temperature gradient of 300° C./μm or more. That is, the optical system 22, as shown in FIG. 4B, cannot provide a driving force enough to cause a crystal to grow in a specified direction.

An intensity gradient of an energy beam is explained by using a concrete example. For example, when the conventional optical system 22 with low resolution (for example, the resolution of 10 μm or more) as shown in FIG. 4B is employed and a light-shielding mask having a light intercepting width L of about 2 μm to 3 μm is used and intensity (called as crystallization intensity) of an energy beam which is used to crystallize a semiconductor thin film with the light-shielded region 17 as a starting point is 180 mJ/cm$^2$ and intensity of an energy beam (called as irradiation intensity) in the aperture portion 18 is 400 mJ/cm$^2$, an intensity gradient of the energy beam becomes about 73.3 (=(400−180)/3) mJ/cm$^2$/μm to 110 (=(400−180)/2) mJ/cm$^2$/μm. Unlike in the case of using the conventional optical system 22, when the optical system 21 with high resolution (for example, a resolution of 4 μm or less) as shown in FIG. 4A is employed and a light-shielding mask having a light intercepting width L of 1 μm or less is used and, as shown in FIG. 5, intensity (called crystallization intensity) of an energy beam which is used to crystallize a semiconductor thin film with the light-shielded region 17 as a starting point 16 is 180 mJ/cm$^2$ and intensity (called irradiation intensity) of an energy beam in the aperture portion 18 is 400 mJ/cm$^2$, an intensity gradient of the energy beam becomes 220 (=(400−180)/1) mJ/cm$^2$/μm or more.

Thus, according to the present invention, such the large intensity gradient of an energy beam as described above is realized by the optical system with high resolution and, as a result, a temperature gradient in the light-shielded region becomes large, which enables the temperature gradient of 300° C./μm or more to be achieved. On the other hand, the conventional low-resolution optical system provides a small intensity gradient of an energy beam, which makes it impossible to increase the temperature gradient in the light-shielded region. Due to this, in the present invention, even if a width of a light intercepting pattern (mask pattern 12) is made narrow and the light-shielded region is made small, the intercepting portion can be made to have a temperature gradient necessary to cause a crystal to grow in a specified direction.

An upper limit of the temperature gradient of an energy beam may be set at 20000° C./μm, preferably at 13300° C./μm. The upper limit of the temperature gradient is set by taking into consideration an abrasion in a region corresponding to an aperture portion caused by excess energy and micro-crystallization in a region corresponding to a light-shielded region. That is, a difference ($T_H$−$T_L$) between a maximum temperature $T_H$ at which an abrasion does not occur in an aperture portion where an energy beam directly strikes a semiconductor thin film (for example, in the case of silicon, its boiling point being 3267° C. is an upper temperature) and a temperature $T_L$ which becomes a starting point for melt and re-crystallization in a light-shielded region where an energy beam is intercepted (for example, in the case of a-Si, its melting point being 1150° C. is a lower limit temperature and in the case of poly-Si, its melting point being 1410° C. is a lower limit temperature) is an upper limit of the temperature gradient. Therefore, according to the present invention, in the case of 0.1 μm which is the best resolution to be applied when a high-resolution optical system is used, the upper limit of a temperature gradient is about 20000° C./μm [($T_H$−$T_L$)/resolution=(3267−1150)/0.1]. Moreover, results from experiments shown in FIG. 2 and FIGS. 7 and 10 (described later) show that it is preferable that a high-resolution optical system with a resolution of 0.15 μm is used so that a center position of 0.15 μm being a half of a light-shielding width L being 0.3 μm becomes a starting point for melt and re-crystallization. In that case, an upper limit of a temperature gradient is preferably about 13300° C./μm being two thirds of 20000° C./μm being the temperature gradient described above.

Moreover, the "abrasion" denotes a phenomenon in which a semiconductor thin film melts, boils, and evaporates. The micro-crystallization (or amorphization) occurs after transition from equilibrium to non-equilibrium caused by rapid cooling. Therefore, to prevent occurrence of micro-crystallization in a region corresponding to a light-shielded region, it is desirable that solidification of a semiconductor thin film starts with the semiconductor thin film kept in equilibrium thermodynamically. For the boiling point and melting point described above, refer to "Semiconductors and semimetals", Vol. 23, Pulsed laser processing of semiconductors, Edited by R. F. Wood, C, W, White and R. T. Young, Academic Press, Inc., Orland, 1984.

According to the experiment described above, when, by applying a laser having energy intensity of 400 mJ/cm$^2$ to an a-Si thin film with a thickness of, for example, 60 nm, the a-Si thin film was melt and re-crystallized using an optical system with a resolution of 1 μm, the temperature gradient was [2428° C. (temperature reached by irradiation of the laser having the energy intensity of 400 mJ/cm$^2$)−1150° C. (melting point of a-Si)]/1 μm=about 1200° C./μm. Moreover, when, by applying a laser having the energy intensity of 600 mJ/cm$^2$ to the a-Si thin film with the thickness of, for example, 60 nm, the a-Si thin film was melt and re-crystallized using an optical system with a resolution of 1 μm, the temperature gradient was [3267° C. (temperature reached by irradiation of the laser having the energy intensity of 600 mJ/cm$^2$)−1150° C. (melting point of a-Si)]/1 μm=about 2100° C./μm. This result shows that the preferable temperature gradient ranges between 1200° C./μm and 2100° C./μm.

When a cost and life of an optical system to be used are taken into consideration, it is desirable that both resolution of the optical system and irradiation intensity of a laser to be used are made low to some extent. To achieve, at least, the objects of the present invention, from a viewpoint of the cost and life of the optical system, it is preferable that an optical system with a resolution of, for example, 4 μm is used and a laser having energy intensity of, for example, 400 mJ/cm$^2$ is applied to melt and re-crystallize a semiconductor film.

Also, according to another experiment, when, by applying a laser having energy intensity of 400 mJ/cm$^2$ to an a-Si thin film with a thickness of, for example, 60 nm, the a-Si thin film was melt and re-crystallized using an optical system with a resolution of 4 μm, the temperature gradient was [2428° C. (temperature reached by irradiation of the laser having the energy intensity of 400 mJ/cm$^2$)−1150° C. (melting point of a-Si)]/4 μm=about 300° C./μm. Moreover, when, by applying a laser having the energy intensity of 400 mJ/cm$^2$ to an a-Si thin film with a thickness of, for example, 60 nm, the a-Si thin film was melt and re-crystallized using an optical system with a resolution of 1 μm, the temperature gradient was [2428° C. (temperature reached by irradiation of the laser having the energy intensity of 400 mJ/cm$^2$)−1150° C. (melting point of a-Si)]/1 μm=about 1200° C./μm. This result shows that the preferable temperature gradient ranges between 300° C./μm and 1200° C./μm.

It is desirable that energy of a laser sufficiently enough to cause, at least, melt and re-crystallization to occur with a light-shielded region as a starting point is applied to the light-shielded region. According to another experiment, it was also confirmed that, when an a-Si thin film with a thickness of, for example, 60 μm was irradiated with an excimer laser with a wavelength of 308 μm and with energy intensity of 400 mJ/cm$^2$, with light being intercepted by a light-shielding mask having a light-shielding width of 1 μm and using an optical system with a resolution of 1 μm, energy intensity of 180 mJ/cm$^2$ was applied to a light-shielded region and, as a result, a temperature of the light-shielded region exceeded 1150° C. being a melting point of a-Si, and melt and re-crystallization of the silicon thin film occurred with the light interception portion as a starting point. Moreover, at this point, since the energy intensity of 400 mJ/cm$^2$ is applied to an aperture portion, a temperature gradient in the light-shielded region became about 220° C./μm and, at the starting point, growth of a crystal in a direction along the temperature gradient was observed (see FIG. 5). As a result, as shown in FIG. 5, a demarcation line at the starting point became a clear straight line or approximately a straight line.

On the other hand, according to another experiment, when a silicon thin film with a thickness of, for example, 60 μm was irradiated with an excimer laser with a wavelength of 308 nm and with energy intensity of 400 mJ/cm$^2$, with light being intercepted by a light-shielding mask having a light-shielding width of 3 μm and using an optical system with a resolution of 10 μm, energy of 180 mJ/cm$^2$ was applied to the light-shielded region and, as a result, a temperature of the light-shielded region exceeded 1150° C. being the melting point of a-Si, and melt and re-crystallization of the silicon thin film occurred with the light interception portion as a starting point. At this point, though energy of 400 mJ/cm$^2$ was applied to the aperture portion, since the temperature gradient in the light-shielded region was as gentle as about 73.3° C./μm and, at the starting point, growth of the crystal in a direction other than the above direction (upper and downward direction in FIG. 6) tended to occur as well, the demarcation line at the starting point was not a straight line (see FIG. 6).

Since such the temperature gradient as described above is made in the light-shielded region, the growth of the crystal in a direction being vertical to a direction of the temperature gradient (left and right directions in FIG. 4) is suppressed and growth of the crystal in the direction of the temperature gradient is facilitated.

Figure 7:
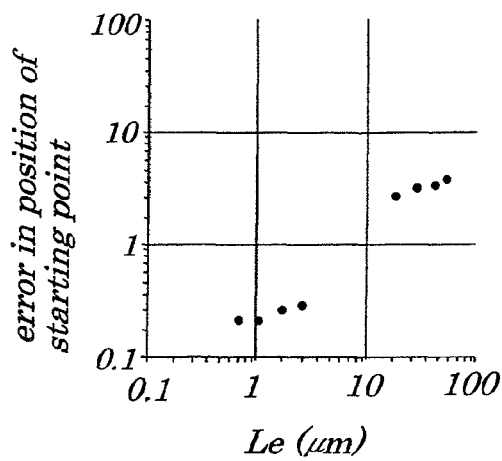
FIG. 7 is a graph showing a relation between a length "Le" in which an intensity gradient of an energy beam occurs and an error in relative positions relative to a starting point for crystallization in an light-shielded region where light is intercepted by a light-shielding mask according to the first embodiment of the present invention.
Figure 8:
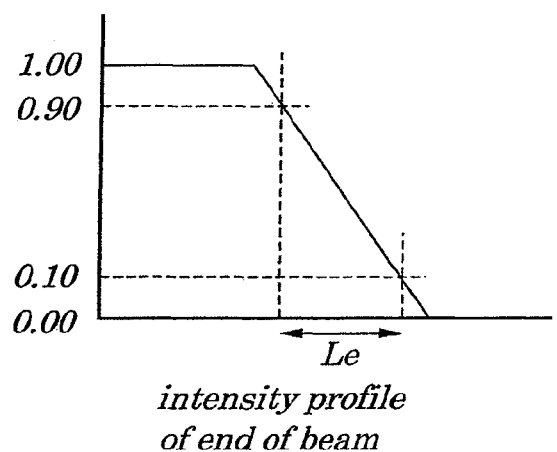
FIG. 8 is a diagram explaining a length "Le" corresponding to a slope portion of an intensity gradient of an energy beam according to the first embodiment of the present invention.
Figure 9:
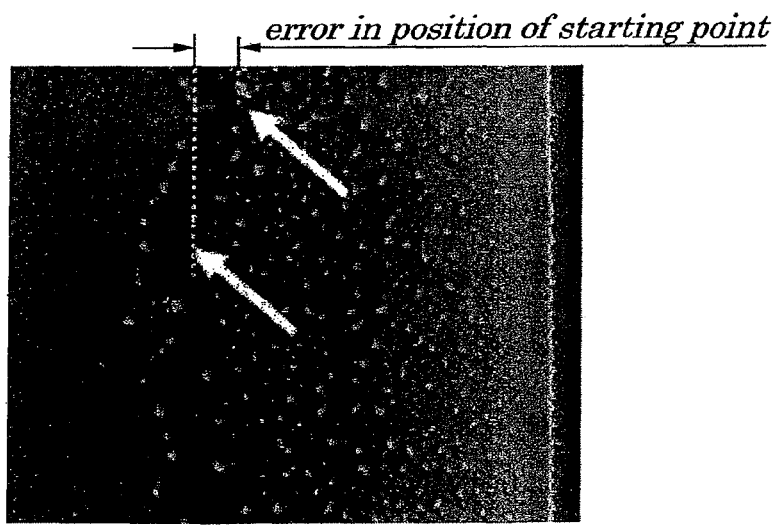
FIG. 9 is a diagram showing an error in a relative position (degree of meandering) relative to a starting point for crystallization according to the first embodiment of the present invention.

FIG. 7 is a diagram showing a relation between a length "Le" in which an intensity gradient of an energy beam occurs and an error in a relative position (degree of meandering) relative to the starting point 16 for crystallization in the light-intercepted portion 17 where light is intercepted by the light-shielding mask 11 shown in FIG. 1. Moreover, FIG. 8 is a diagram explaining a length "Le" of a slope portion indicating an intensity gradient of an energy beam. FIG. 9 is a diagram showing an error in a relative position (degree of meandering) relative to the starting point 16 for crystallization. The length "Le" of a slope portion indicating an intensity gradient is calculated from a result of measurement of an intensity gradient of the energy beam described above and, as a result of taking into consideration variations in intensity, in a fine region, of raw laser ray being unable to be corrected by an optical uniforming unit, variations in performance of an optical uniforming unit, or a like, the length within an intensity range from 0.10 to 0.90 obtained when a beam intensity is set at 1.00 is defined as a length "Le" of a slope portion. Moreover, when the starting point 16 is recognized, by noting a structural change in a crystal, a position in which a fine grain region and coarse and a big crystal are in contact with each other is used as a starting point and variations (errors) in the position of the starting point are expressed numerically The result shown in FIG. 7 shows that, in order to effectively reduce an error in a position of a starting point, Le≤4 μm. Thus, according to the present invention, based on the above result, an optical system with resolution being so high that a length "Le" in which an intensity gradient of an energy beam occurs is 4 μm or less, more preferably 1 μm or less in the light-shielded region, is preferably used and, as a result, a temperature gradient is made large and the crystal can be made to grow in a direction of the temperature gradient.

Figure 10:
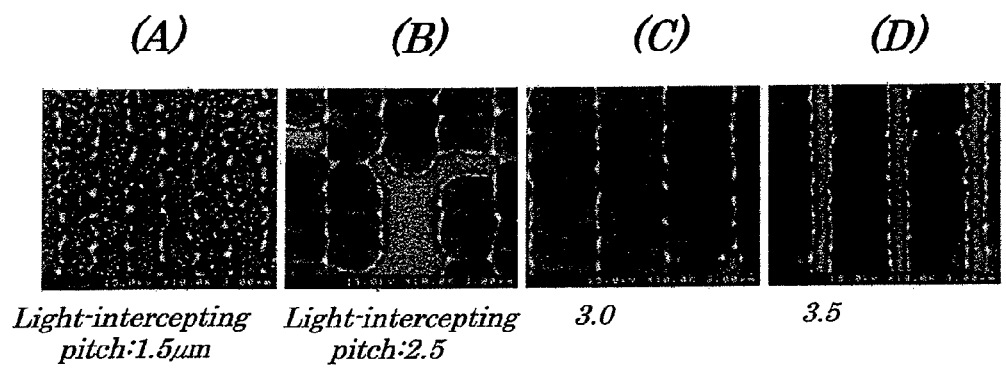
FIG. 10 is a magnified plan photo showing a state of melt and re-crystallization of a silicon thin film obtained when a pitch of a mask pattern is changed according to the first embodiment of the present invention.

Next, arrangement pitches (P) of the stripe-shaped mask patterns in the light-shielding mask are explained. FIG. 10 shows a state of melt and re-crystallization of a silicon thin film occurred when a light-shielding width L of the stripe-shaped mask pattern formed in the light-shielding mask is set at 0.3 μm and a pitch of the mask pattern is changed between 1.5 μm and 3.5 μm. At this point, a irradiation intensity of an energy beam was set at 578 mJ/cm$^2$.

As shown in FIG. 9, it was confirmed from the experiment that, when the pitch was between 2.5 μm to 3.5 μm, growth of the crystal in a direction of an intensity gradient of an energy beam occurred. However, when the pitch was 1.5 μm, no growth of the crystal in a horizontal direction was observed. The reason seems to be that, due to large amounts of energy supplied to the silicon thin film and additionally due to thermal diffusion in a horizontal direction, a temperature in a region where light was to be intercepted rose excessively. When the pitch was 3.0 μm, the irradiated region was filled with crystals having grown in a horizontal direction from adjacent light-shielded regions and desirable growth of the crystals, in particular, was observed. When the pitch was 3.5 μm, a phenomenon in which a clearance among crystals having grown from the adjacent starting points in a horizontal direction was observed. This phenomenon occurs due to the reason that a nucleus almost spontaneously and randomly occurred by being cooled by thermal conduction to the substrate before crystals obtained by horizontal epitaxial growth with the starting point of the adjacent light-shielded region as a nucleus were in contact with one another and, as a result, polycrystalline films (micro-crystal film or amorphous crystal film) having crystal grains being relatively small in size were formed. When the pitch was 2.5 μm, the epitaxial growth in the horizontal direction progressed and terminated when crystals obtained by the epitaxial growth were in contact with one another. However, as in the case where the pitch was 1.5 μm, there existed partially some regions in which, due to large amounts of energy supplied to the semiconductor thin film and additionally due to thermal diffusion in a horizontal direction, a temperature in the region where light was to be intercepted rose excessively. This phenomenon seems to have occurred due to non-uniformity being inherent in the intensity of a irradiation beam.

These results show that it is desirable that the arrangement interval among the light-shielded regions is shorter than growth distance determined depending on a parameter such as an intensity and, more particularly, a relation between a pitch P of the light-shielding pattern and the light-shielding width L is given by an expression of "pitch P/light-shielding width L>5 (=1.5/0.3)" and preferably by an expression of "pitch P/light-shielding width L=10 (>1.5/0.3)". From a viewpoint that a silicon thin film having crystal grains being large in size is obtained, after the above conditions are met, arrangement intervals of the light-shielded region are made preferably as long as possible.

An upper limit of a value calculated by the expression of "a pitch P/a light-shielding width L" is set within a range in which a clearance does not occur among crystals having grown in a horizontal direction from an adjacent starting point. Main parameters include a value obtained by the expression of "a pitch P/a light-shielding width L", irradiation intensity of an energy beam, a thickness of a film, a waveform of a beam pulse, or a like. By calibrating these parameters, the problem of occurrence of the clearance can be solved.

Figure 11:
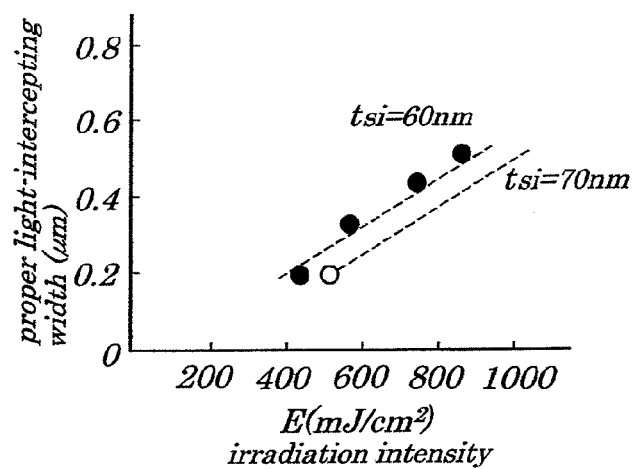
FIG. 11 is a graph showing a relation between irradiation intensity of an energy beam and a light-shielding width of a light-shielding pattern by which excellent growth of a crystal by melt and re-crystallization occurs under irradiation intensity according to the first embodiment of the present invention.

FIG. 11 is a graph of a result from an experiment showing a relation between irradiation intensity of an energy beam of 400 mJ/cm$^2$ to 900 mJ/cm$^2$ and the light-shielding width L of a light-shielding pattern by which excellent growth of a crystal by melt and re-crystallization occurs under the irradiation intensity according to the present invention.

The light-shielding width L of a light-shielding pattern is in proportion to irradiation intensity of an energy beam. Therefore, according to the experiment, when the irradiation intensity was made large, in order to cause growth of a crystal to occur by excellent melt and re-crystallization under the irradiation intensity, it was necessary to make large the light-shielding width L. Moreover, when a thickness of the semiconductor thin film was increased from 60 nm to 75 nm, by shifting the irradiation intensity to a side of high intensity, growth of a crystal by excellent melt and re-crystallization was made possible.

From the above result, the relation between the irradiation intensity and the light-shielding width L, which can cause growth of a crystal by excellent melt and re-crystallization to occur, is expressed by an equation of "L (μm)=a×E (mJ/cm$^2$) b", where "a" and "b" denote coefficients which vary depending on a thickness of a semiconductor thin film being an object to be irradiated.

The light-shielding width L, as is apparent from FIG. 11, is set according to the irradiation intensity, thickness of the semiconductor thin film, or a like and is preferably 0.2 μm to 0.5 μm and more preferably 0.3 μm to 0.5 μm. Here, when the light-shielding width "L" was less than 0.2 μm, no effect of light-shielded region was obtained and micro-crystallization occurred on an entire of the semiconductor thin film and no growth of the silicon crystal in a horizontal direction was observed. Also, if the light-shielding width "L" exceeded, for example, 0.5 μm, though horizontal growth of the crystal occurred, amorphous layer resided in a center of light-shielded region.

Moreover, energy is given to the light-shielded region so that melt and re-crystallization occurs with the light-shielded region as a starting point. The energy to be given is different depending on a kind of semiconductor thin film and/or its thickness, however, if the thin film is an a-Si thin film with a thickness of 75 nm formed on a glass substrate, its energy intensity is preferably within a range of 170 mJ/cm$^2$ to 200 mJ/cm$^2$. In the light-shielded region where such the energy is given, a nucleus for melt and re-crystallization is produced and a crystal grows with the nucleus as a starting point. For example, as shown in FIG. 1B, since the stripe-shaped light-shielding pattern having the light-shielding width L is formed, the crystal of the semiconductor thin film grows in a direction (left and right directions in FIG. 1B) in which a temperature gradient occurs with the produced nucleus as the starting point. At this point, it is preferable that the light-shielding regions are arranged periodically at appropriate pitches and, for example, as shown in FIG. 2, the semiconductor thin film having grown in a horizontal direction can be obtained.

Moreover, according to the present invention, in order to induce excellent growth of the crystal, for example, the semiconductor thin film having been melt by irradiation with an energy beam is cooled at a speed that does not cause micro-crystallization. Since it was found that micro-crystallization in an a-Si thin film with a thickness of 60 nm occurs when being cooled at a speed of about 1.6×10$^{10}$° C./sec or more, by controlling the cooling speed so as to be smaller than the speed of 1.6×10$^{10}$° C./sec, micro-crystallization and amorphization in the a-Si thin film can be prevented and a process of excellent growth of the crystal can be achieved.

In the semiconductor thin film manufactured by the methods described above, that is, in the semiconductor thin film having been melted and re-crystallized, a thickness of a starting point portion from which growth of the crystal of the semiconductor thin film having been melted and re-crystallized starts is smaller than a thickness of a terminating portion of growth of the crystal and growth of its crystal occurs in a direction of the thickness gradient. For example, when an a-Si thin film with a thickness of 75 nm was melted and re-crystallized by irradiation with an excimer laser with a wavelength of 308 nm having energy intensity of 820 mJ/cm$^2$ by the same method as employed by the melt and re-crystallizing unit, a film thickness of the starting point portion in which the melt and re-crystallization start was about 60 nm and a thickness of a terminating portion of growth of the crystal was about 100 nm. Such the phenomenon as described above, that is, the phenomenon in which the thickness of the starting point portion in which the melt and re-crystallization start is smaller than the thickness of a terminating portion of growth of the crystal and growth of the crystal occurs in a direction of a thickness gradient is one that occurs regardless of the initial film thickness, is a specific mode of the method of manufacturing of the present invention. This phenomenon was confirmed even in the case in which the crystal of the above semiconductor thin film grew from its starting point for the growth, at least, in two directions.

The manufacturing equipment of the present invention, to be described later (and above), employed in the method for manufacturing the semiconductor thin film and the TFT of the present invention has a laser irradiation device which can cause, by applying an energy beam to the light-shielding elements each being arranged between the semiconductor thin film and an energy beam radiating source, the crystal to grow in a desired direction with the light-shielded region of the semiconductor thin film as a starting point. Moreover, in the manufacturing equipment for fabricating a thin film transistor described later, an energy beam is applied by using gate electrodes each being arranged between a semiconductor thin film covered with a gate insulating film and an energy beam irradiation source as a light-shielding element.

The above manufacturing equipment employed in the method for manufacturing the semiconductor thin film has the irradiation device equipped with an optical system with a resolution of 4 μm or less to achieve the above growth of the crystal. That is, since the irradiation device has the optical system with a resolution of 4 μm or less, as described above, it is made possible to give a local temperature gradient which enables the crystal to grow in a desired direction with the light-shielded region as the starting point to the light-shielded region in which light is intercepted by the light-shielding element (or the gate electrode).

Also, a light-shielding pattern constructed by forming the light-shielding pattern on a transparent substrate is preferably employed as the light-shielding element to be employed in the above irradiation device in terms of convenience and a ratio (P/L) of a light-shielding width L of the light-shielding pattern to a pitch P for the light-shielding pattern is preferably 1 (one) or more. The light-shielding width L of the light-shielding pattern is preferably 0.3 μm or more. The reasons for this have been already described above and description of it is omitted accordingly. Moreover, in the case of the TFT, the gate electrode constructed by being formed with the gate insulating film being interposed between the gate electrode and the semiconductor thin film acts as the light-shielding element and its light-shielding width L is a width of the gate electrode.

According to the present invention, in order to achieve more effective processes of melt and re-crystallization of semiconductor thin films, the irradiation device is equipped with a projection exposing unit adapted to simultaneously melt and re-crystallize entire surfaces of the semiconductor thin films by applying an energy beam one pulse. The projection exposing unit that can be employed in the present invention may be selected from various types of projection exposing units depending on kinds or energy intensity of an energy beam to be used, an area of an object to be irradiated in which growth of the crystal is expected. For example, a reduction projection optical system, 1:1 projection optical system, or expansion projection optical system can be attached to the irradiation device to construct the manufacturing equipment of the present invention.

Figure 12:
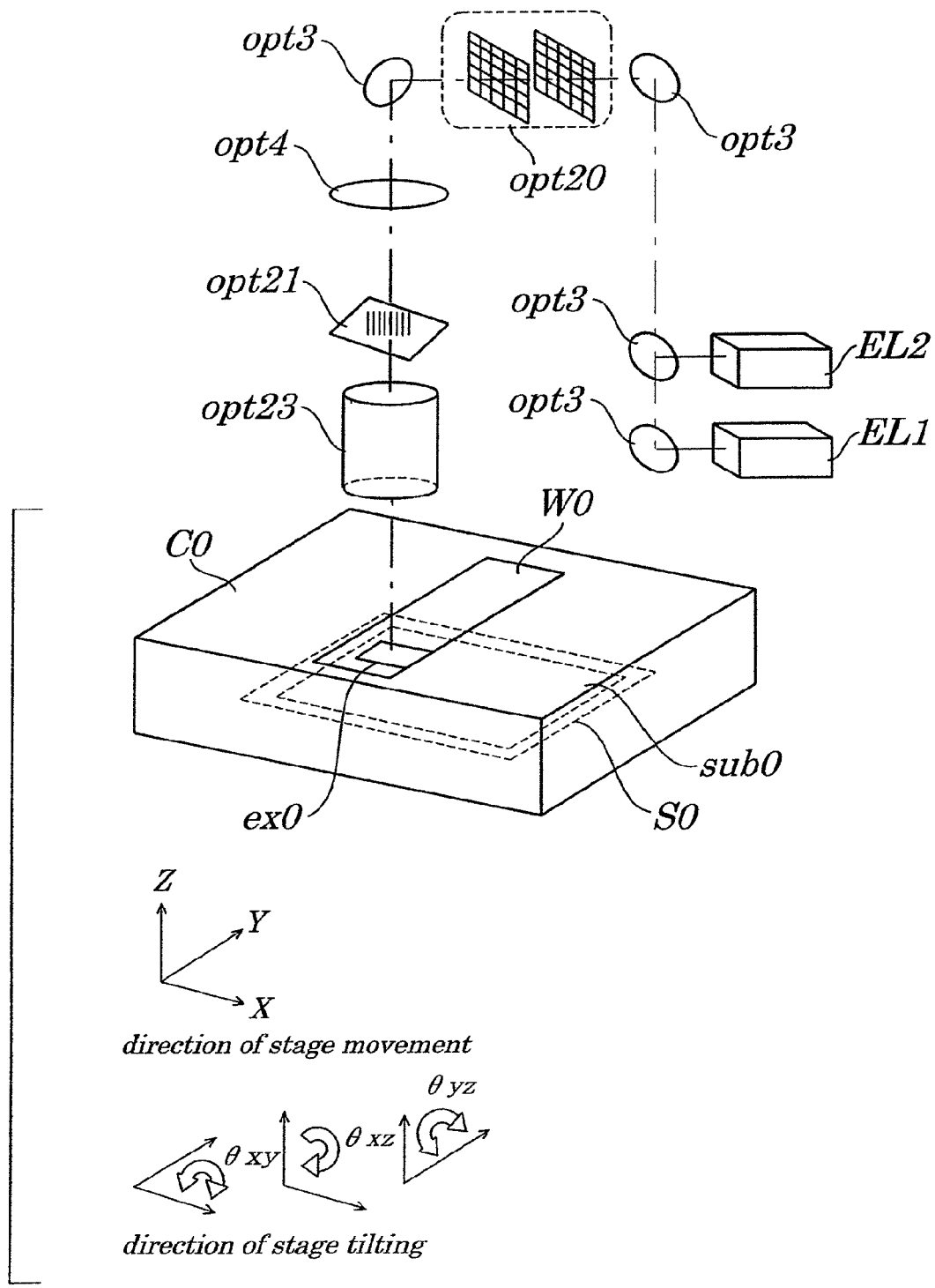
FIG. 12 is a diagram showing configurations of one example of a irradiation device preferably employed in the method for manufacturing a semiconductor thin film according to the first embodiment of the present invention.
Figure 13:
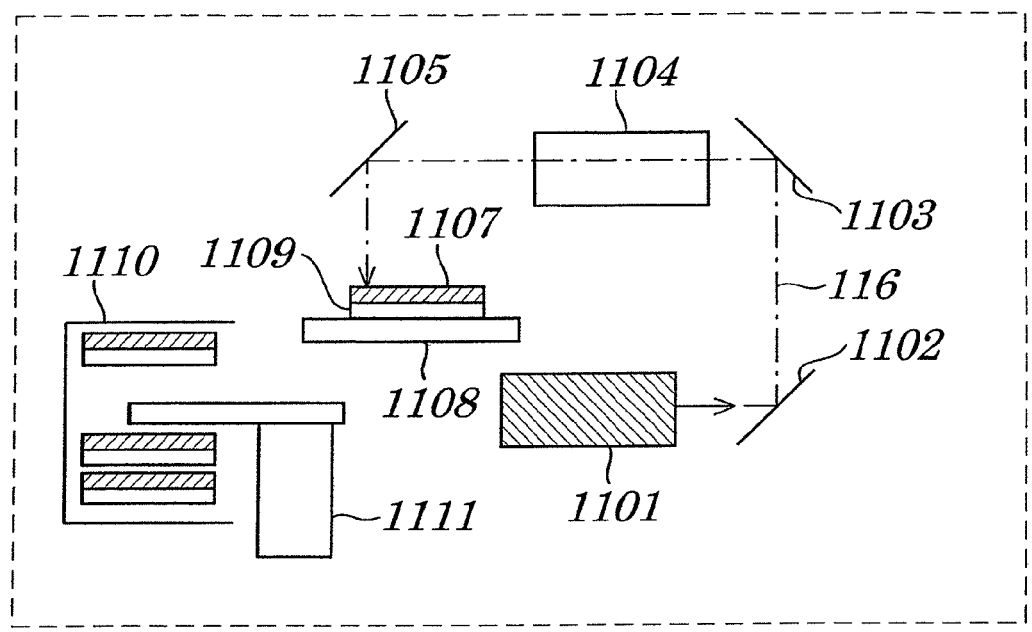
FIG. 13 is a diagram showing configurations of one example of a pulse laser irradiation device being able to be used in the method for manufacturing the semiconductor film according to the first embodiment of the present invention.

FIGS. 12 and 13 show one example of irradiation devices being applicable to manufacturing of a semiconductor thin film and TFT of the present invention. FIG. 12 is a diagram showing configurations of one example of a irradiation device preferably employed in the method for manufacturing a semiconductor thin film according to the present invention.

In the irradiation device as shown in FIG. 12, pulse UV (Ultra-violet) light supplied from a first excimer laser EL1 and a second excimer laser EL2 is introduced via mirrors opt3 and a lens opt4 into a homogenizer opt20. An intensity profile of the UV light beam is shaped by the homogenizer opt20 so that it has a desired uniformity, for example, its distribution within a surface becomes ±5% at the optical mask opt21.

Moreover, there are some cases in which an intensity profile or a total energy amount of energy of the beam supplied originally from the excimer lasers varies among pulses, the irradiation device preferably has a mechanism to uniform spatial distribution of its intensity and/or variations in its intensity among pulses on an optical mask. As the homogenizer opt20, a flyeye lens or a cylindrical lens is generally used.

An optical pattern formed by the above optical mask is applied via a reduction projection exposure system opt23 and a laser introducing window W0 to a substrate sub0 placed within a vacuum chamber C0. The substrate sub0 is placed on a substrate stage S0 and the optical pattern is exposed, by operations of the substrate stage S0, in a desired region on the substrate sub0, for example, on a pattern transfer region ex0. Though an example in which the reduction projection exposure system opt23 is used is shown in FIG. 12, a 1:1 projection optical system or expansion projection optical system may be employed depending on a situation.

By movement of the substrate stage S0 (directions X-Y in FIG. 12), an arbitrary region on the substrate sub0 is irradiated with a laser. Also, the optical mask on which the light-shielding pattern is formed is placed on a mask stage (not shown). The beam applied to the substrate sub0 is controlled by movement of the optical mask within an exposure enabled region.

Next, a mechanism adapted to apply an optical pattern to the substrate sub0 under a desired condition is described. Since calibration of an optical axis requires delicate calibrating operations, a method in which an optical axis having already completed the calibration is fixed to adjust a position of the substrate sub0 is shown in descriptions below.

A position of a substrate irradiation surface relative to an optical axis is corrected by a position of a focus alignment direction Z and verticality relative to an optical axis. More specifically, out of a tilt correcting direction θxy, tilt correcting direction θxz, tilt correcting direction θyz, exposure region movement direction X, exposure region movement direction Y, and the focus alignment direction Z, by calibrating the tilt correcting direction θxy, tilt correcting direction θxz, and tilt correcting direction θyz, the verticality relative to the optical axis is corrected. Moreover, the substrate irradiation surface is controlled to be arranged in a position corresponding to a focus depth of an optical system by calibrating the focus alignment direction Z.

In the TFT being formed on an insulator in particular, since a glass substrate being inferior to a silicon wafer in surface accuracy is used as the insulator, such the irradiation device as is equipped with a correcting mechanism described above is required to be effective in achieving good growth of the crystal of the semiconductor thin film.

Moreover, a pulse laser irradiation device as shown in FIG. 13 may be used in the manufacture of the semiconductor thin film or TFT of the present invention.

In the pulse laser irradiation device shown in FIG. 13, laser ray being supplied from a pulse laser source 1101 reaches a silicon thin film 1107 being an object to be irradiated through an optical path 116 defined by an optical device group including mirrors 1102, 1103, and 1105 and a beam homogenizer 1104 on a glass substrate 1109. An aim of the beam homogenizer 1104 is to uniform spatial intensity of the beam to be applied. In such the irradiation device as above, laser irradiation to an arbitrary position on the substrate is performed by moving the glass substrate 1109 on an xy-stage 1108. The laser irradiation to an arbitrary position on the substrate may be performed not only by moving the xy stage but also by moving the optical element group described above or by a method in which movement of the optical element group is combined with that of the stage. For example, the laser irradiation may be performed by placing the substrate on an x-direction stage and the homogenizer on a y-direction stage. Moreover, the laser irradiation may be performed in a vacuum within a vacuum chamber or in a high-purity gas environment. Moreover, the laser irradiation device may be equipped with a glass-substrate containing cassette 1110 in which a silicon thin film is formed and a substrate transporting mechanism 1111, as needed. The substrate may be mechanically put and withdrawn between the cassette and the stage.

According to the present invention, since the manufacturing equipment having such the irradiation device as described above, melt and re-crystallization of a semiconductor thin film can be efficiently realized. A remarkable effect of the present invention is that melt and re-crystallization can be achieved by one pulse irradiation with an energy beam even if the semiconductor thin film has a large area in particular.

Second Embodiment

Another Method for Manufacturing Semiconductor Thin Film

Next, a method for manufacturing semiconductor thin film according to a second embodiment of the present invention will be described. By employing the method for manufacturing a semiconductor thin film of the present invention described above, as shown in FIG. 14, a silicon crystal could be grown radially by melt and re-crystallization.

Figure 14:
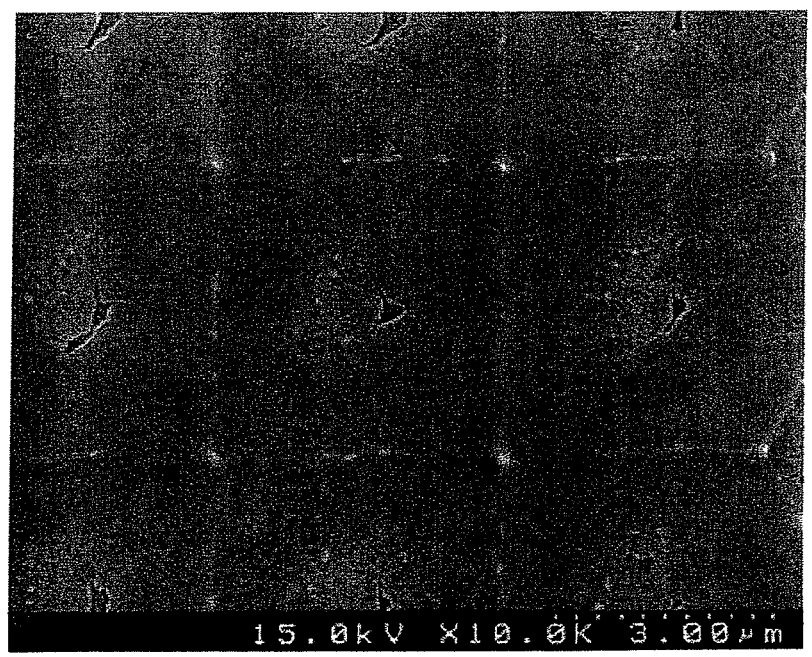
FIG. 14 is a magnified plan photo showing a state of a crystal of a silicon thin film realized according to a second embodiment of the present invention.

For example, the silicon crystal shown in FIG. 14 is obtained by using the light-shielding mask in which dot-shaped light-shielding patterns each having a diameter of 1.5 µm are placed at an equal interval pitch of about 4 µm and applying an excimer laser with a wavelength of 308 nm and with an energy intensity of 467 mJ/cm$^2$ to a silicon thin layer with a thickness of 60 µm. As is understood from FIG. 14, the silicon crystal grows radially from the light-shielded region and no clearance is observed between the silicon crystal having grown from the light-shielded region and the silicon crystal having grown from adjacent light-shielded regions.

Third Embodiment

A Method for Manufacturing TFT

Next, a method for manufacturing TFT according to a third embodiment of the present invention will be described. The method for manufacturing a semiconductor thin film described above is applied to manufacturing of a TFT according to the embodiment. An example of the method for manufacturing a TFT that can obtain a crystallized film in a desired region in a self-aligning manner is explained by referring to a process flow diagram shown in FIGS. 15A to 15I, and FIG. 15I'.

That is, in the method for manufacturing a TFT of the present invention, a crystallized film whose crystal grows in one direction with a light-shielded region of a semiconductor thin film as a starting point is formed by using a gate electrode formed on the semiconductor thin film with a gate insulating film being interposed between the gate electrode and the semiconductor thin film as a light-shielding element and by applying an energy beam to the semiconductor thin film. Thus, this embodiment is characterized in that the irradiation of an energy beam can give energy to the light-shielded region so that it can act as the starting point for melt and re-crystallization of the semiconductor thin film and so that a local temperature gradient in the light-shielded region is made to be 300° C./µm or more.

In the method for manufacturing a TFT according to this embodiment, by employing the gate electrode formed on the gate insulating film as the light-shielding element, a starting point for melt and re-crystallization is formed in the silicon thin film positioned in a downward direction of the gate electrode. Then, the silicon crystal is made to grow in a self-aligning manner from the starting point in a direction of a width of the gate electrode. Since the direction of growth of the silicon crystal matches the direction (source-drain) of carrier transport in a channel, the obtained silicon thin film becomes an active layer having a high characteristic of carrier transport. The method for manufacturing a TFT of the embodiment can be preferably applied in the case in which a length of a channel reaches a sub-micron level.

Figure 15A:
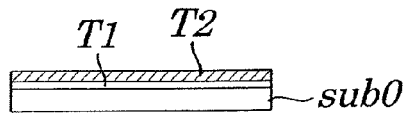
FIGS. 15A to 15I, and FIG. 15I' are process flow diagrams of the method for manufacturing a TFT according to a third embodiment of the present invention.

As shown in FIG. 15A, a substrate cover film T1 and a silicon thin film T2 are sequentially formed on a glass substrate sub0 from which organic substances, metals, fine particles, or a like have been removed by cleaning.

A silicon oxide film with a thickness of 1 µm is formed as the substrate cover film T1 using silane and oxygen gas as its materials by an LPCVD (Low Pressure Chemical Vapor Deposition) method under condition of 450° C. By using the LPCVD method, an entire outer surface of the substrate except a substrate holding region can be covered (not shown). Instead of the LPCVD method, a plasma CVD method using tetraethoxysilane (TEOS) and oxygen as its material, an atmospheric CVD method using TEOS and ozone as its material, a remote plasma CVD method in which a deposition region is separated from a plasma generating region, or a like may be used. As the substrate cover film T1, materials being able to prevent diffusion of an impurity, contained in a substrate material, harmful to a semiconductor device, such as glass with alkaline metal concentration reduced to a minimum and quarts and glass whose surface is polished, or a like, are effectively used.

The silicon thin film T2 is formed by the LPCVD method using disilane as its material at 500° C. so that the silicon thin film T2 has a thickness of 75 nm. At this point, since a hydrogen atom concentration contained in the silicon thin film T2 is 1 atom % or less, a film roughness and a like caused by a release of hydrogen in a process of laser irradiation (described later) can be prevented. Moreover, the silicon thin film T2 can be formed also by using the plasma CVD method, and by adjusting a substrate temperature, a flow rate of hydrogen to silane, a flow rate of hydrogen to silane tetrafluoride, or a like, a silicon thin film having a low hydrogen atom concentration can be formed.

Figure 15B:
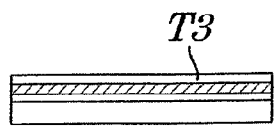

Next, the above substrate, after gas in a thin film forming equipment has been exhausted, is transported to a plasma CVD chamber through a substrate transport chamber. Then, in the plasma CVD chamber, as shown in FIG. 15B, a first gate insulating film T3 is deposited on the silicon thin film T2. The gate insulating film T3 is made up of a silicon oxide film with a thickness of 10 nm deposited at a substrate temperature of 350° C. by using silane, helium, and oxygen as material gas. Thereafter, as necessary, hydrogen plasma processing and heat annealing processing are performed on the first gate insulating film T3. A sequence of Processing as described above is performed in the thin film forming equipment.

Figure 15C:
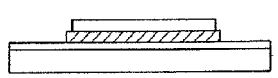

Next, as shown in FIG. 15C, a layer-stacked island made up of the silicon thin film T2 and silicon oxide film (first gate insulating film) T3 is formed by using photolithography and etching technology. At this point, the etching is preferably performed on condition that an etching rate of the silicon oxide film (first gate insulating film) T3 is higher than that of the silicon thin film T2 and, as shown in FIG. 15C, by forming a cross section of the pattern so as to be in a stepped (or tapered) shape, gate leakage is prevented and a TFT with high reliability can be obtained.

Figure 15D:
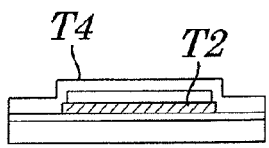

Then, the substrate having undergone the etching processing is cleaned to remove organic substances, metals, fine particles, or a like and, as shown in FIG. 15D, a second gate insulating film T4 is formed in a manner in which the above island is covered. The second gate insulating film T4 is made up of a silicon oxide film with a thickness of 30 nm deposited at 450° C. by the LPCVD method using silane and oxygen gas as its materials. To form the second gate insulating film T4, the plasma CVD method using tetraethoxysilane (TEOS) and oxygen as its material, the atmospheric CVD method, the plasma CVD method or a like using TEOS and ozone as its material, or a like can be used.

Figure 15E:
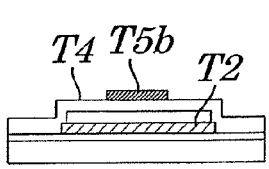

Next, on the second gate insulating film T4 are formed an n$^+$ silicon film with a thickness of 80 nm as a gate n$^+$ electrode and a tungsten silicide film with a thickness of 110 nm. It is desirable that a crystalline phosphorus-doped silicon film formed by the plasma CVD method or LPCVD method is used as an n$^+$ silicon film. Then, after photolithography and etching processes have been performed, as shown in FIG. 15E, a patterned gate electrode T5$b$ is formed.

Figure 15F:
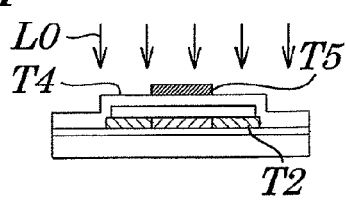

Then, after cleaning to remove organic substances, metals, fine particles, surface oxidized films, or a like has been done, the layer-stacked film is put into the laser irradiation device to irradiate the silicon thin film T2 with a laser ray L0 using the gate electrode T5b as a light-shielding mask, as shown in FIG. 15F. The laser irradiation device that can be used here includes the laser irradiation device shown in FIG. 12 and the pulse laser irradiation device shown in FIG. 13. By irradiation with the laser ray L0, the silicon thin film T2 is changed to a crystallized silicon thin film T6. The laser crystallization is performed in an atmosphere of nitrogen having a purity being as high as 99.9999% or more at a pressure of 700 torr or more and, after the laser irradiation has been completed, oxygen gas is introduced. At this point, by designing a light-shielding width "L" and light-shielding interval "P" properly, crystallization of silicon at a irradiated surface can be realized.

Figure 15G:
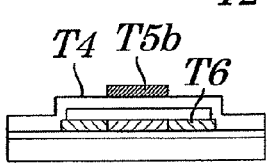
Figure 15G:
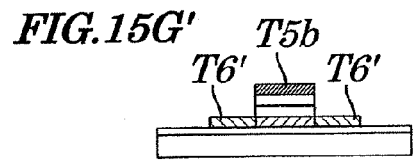

Next, as shown in FIG. 15G and FIG. 15G', an impurity is implanted, using the above gate electrode T5b as a mask, into the crystallized silicon thin film T2 to form an impurity implanted regions T6 and T6'. Moreover, when a CMOS circuit is fabricated, an n-channel TFT requiring an $n^+$ region and p-channel TFT requiring a $p^+$ region are formed in a separated manner by using photo-lithography in combination. As the method for implanting an impurity, ion doping in which mass separation of the impurity to be implanted is not performed, ion implanting, plasma doping, laser doping, or a like can be employed. In the process of impurity implantation, the impurity is implanted with silicon oxide deposited on the surface being left (see FIG. 15G) or with the silicon oxide deposited on the surface being removed (see FIG. 15G'), depending on applications or impurity implanting methods.

Moreover, the process of implanting the impurity shown in FIG. 15G and FIG. 15G' may be performed prior to the process of crystallization shown in FIG. 15F. At this point, at the same time when the laser crystallization process is performed, activation of the impurity implanted by the method described above can be performed.

Figure 15H:
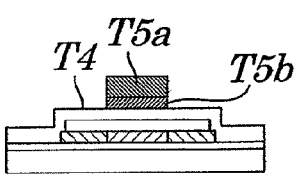
Figure 15I:
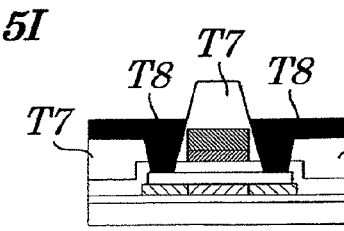
Figure 15I:
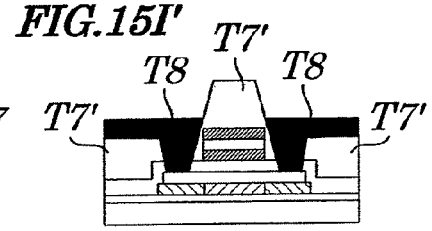

Next, as shown in FIG. 15H, a gate metal electrode T5a is formed, by a patterning operation, on the gate electrode T5b. Then, as shown in FIG. 15I and FIG. 15I', after interlayer separation insulating films T7 and T7' have been deposited, a contact hole is formed and a metal film for wiring is deposited. Furthermore, a metal wiring T8 is formed by using photolithography and etching technology. As the interlayer separation insulating films T7 and T7', a TEOS oxide film, silica coating film, or organic coating film, all of which can achieve planarization of a film, can be employed. The process of forming the contact hole is performed by using photolithography and etching technology. As the metal wiring T8, aluminum of low resistance, copper, aluminum or copper-based alloy, a metal of high melting point such as tungsten, molybdenum, or a like can be used.

By performing such the processes as above, a TFT having high performance and high reliability of the present invention can be formed.

In the TFT manufactured as above, it was confirmed by experiments that, as in the case of the phenomenon described in manufacturing the above semiconductor thin film, a thickness at a starting point from which growth of the silicon crystal of the melted and re-crystallized silicon thin film T6 started was smaller than that at a terminating point of growth of the silicon crystal and the growth of the silicon crystal occurred in a direction of a thickness gradient.

Fourth Embodiment

Another Method for Manufacturing TFT

Next, a method for manufacturing TFT according to a fourth embodiment of the present invention will be described. A case in which an alignment mark is assigned in advance and a laser is irradiated according to the alignment mark or a case in which the alignment mark is produced at the same when a laser is irradiated is described. In these cases, the fourth embodiment of the method for manufacturing a TFT differs from the third embodiment of the method for manufacturing the TFT in following points.

That is, in the case where the alignment mark is assigned in advance and a laser is irradiated according to the alignment mark, a substrate cover film T1 and the tungsten-silicide film are sequentially formed on the glass substrate sub0 from which organic substances, metals, fine particles or a like have been removed by cleaning. Next, in order to form the alignment mark on the substrate, the tungsten silicide film patterned by photo-lithography and etching is formed. Also, in order to protect the alignment mark, a mark protecting film is formed and then a silicon thin film is formed.

In the process thereafter, when exposure is performed using the laser ray, a desired region is exposed by using the alignment mark as a positional reference. Then, an alignment process is performed by using the alignment mark assigned in advance or an alignment mark (not shown) formed by patterning a crystallized silicon thin film as a positional reference.

According to this embodiment, since a process of precisely selecting a crystallized region using a mask projection method is not required, even if a transistor is further miniaturized, crystallization by a laser processing equipment using the same alignment method as the conventional method is made possible and, therefore, time required for the alignment process can be shortened and an increase in costs for the equipment can be suppressed.

Comparative Method for Manufacturing TFT

An example of a comparative (conventional) method for manufacturing a TFT (as disclosed in Japanese Patent Application Laid-open No. 2001-28440) is described by referring to a process flow diagram shown in FIGS. 16A to 16G, and FIG. 16G'. Moreover, since materials for thin films and thin film forming methods employed in the comparative method are the same as employed in the case of the first embodiment of the method for manufacturing a TFT, points that differ from the above first embodiment only are described below.

Figure 16A:
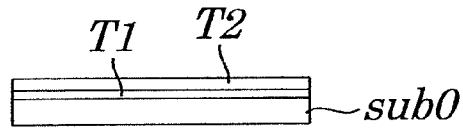
FIGS. 16A to 16G, and FIG. 16G' are process flow diagrams of the comparative (conventional) method for manufacturing a TFT.

First, as shown in FIG. 16A, a substrate cover film T1 and a silicon thin film T2 are sequentially formed on a glass substrate sub0 that have been already cleaned.

Figure 16B:
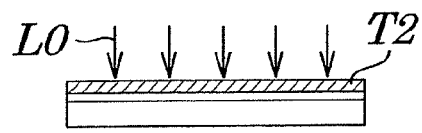

Next, as shown in FIG. 16B, after having cleaned the glass substrate sub0, the glass substrate sub0 is put into a thin film forming equipment having the energy beam irradiation device. In the thin film forming equipment, laser ray L0 is applied to the silicon thin film T2 and the silicon thin film T2 is changed to a crystallized silicon thin film T2. Such the laser crystallization of the silicon thin film is performed in an atmosphere of nitrogen having a purity being as high as 99.9999% or more at a pressure of 700 torr or more. After the laser irradiation has been completed, oxygen gas is introduced.

At this point, by designing a light-shielding width "L" and light-shielding interval "P" properly, crystallization of silicon at a irradiated surface can be realized.

Figure 16C:
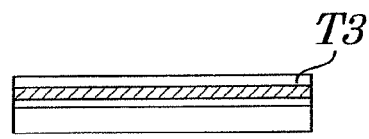

Next, the substrate having undergone the above process, after gas in a thin film forming equipment has been exhausted, is transported to a plasma CVD chamber through a substrate transport chamber. Then, in the plasma CVD chamber, as shown in FIG. 16C, a first gate insulating film T3 (silicon oxide film with a thickness of 10 nm) is deposited on the crystallized silicon thin film T2.

Figure 16D:
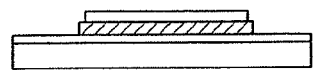

Then, as shown in FIG. 16D, a layer-stacked island made up of the crystallized silicon thin film T2 and silicon oxide film T3 is formed by photolithography and etching technology.

Next, after the substrate having undergone the etching process has been cleaned, a second gate insulating film T4 (silicon oxide film with a thickness of 30 μm) is formed in a manner in which the island is covered with the second gate insulating film T4.

Figure 16E:
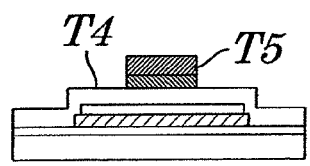
Figure 16F:
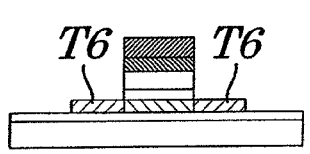
Figure 16F:
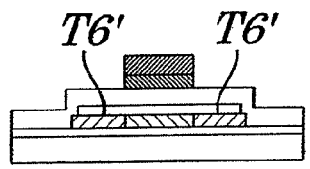

Then, on the second gate insulating film T4 are formed an n$^+$ silicon film with a thickness of 80 nm and a tungsten silicide film with a thickness of 110 nm. Then, after photolithography and etching processes have been performed, as shown in FIG. 16E, a patterned gate electrode T5 is formed.

Next, impurity implanted regions T6, T6 are formed by using the above gate electrode T5 as a mask. Moreover, when a CMOS circuit is fabricated, an n-channel TFT requiring an n$^+$ region and p-channel TFT requiring a p$^+$ region are formed in a separated manner by using photolithography in combination. In the process of impurity implantation, the impurity is implanted with silicon oxide film formed on the surface remaining (see FIG. 16F) or with the silicon oxide film formed on the surface being removed (see FIG. 16F'), depending on various applications or impurity implanting methods.

Figure 16G:
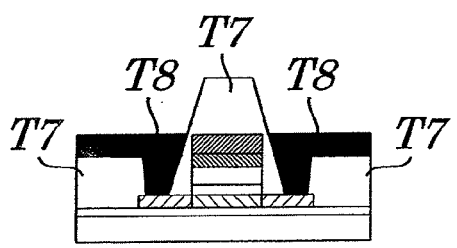
Figure 16G:
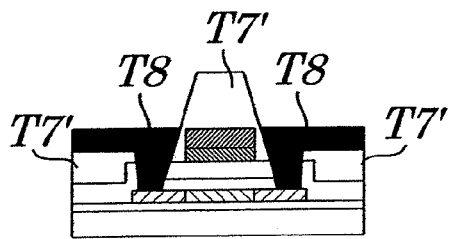
Figure 17:
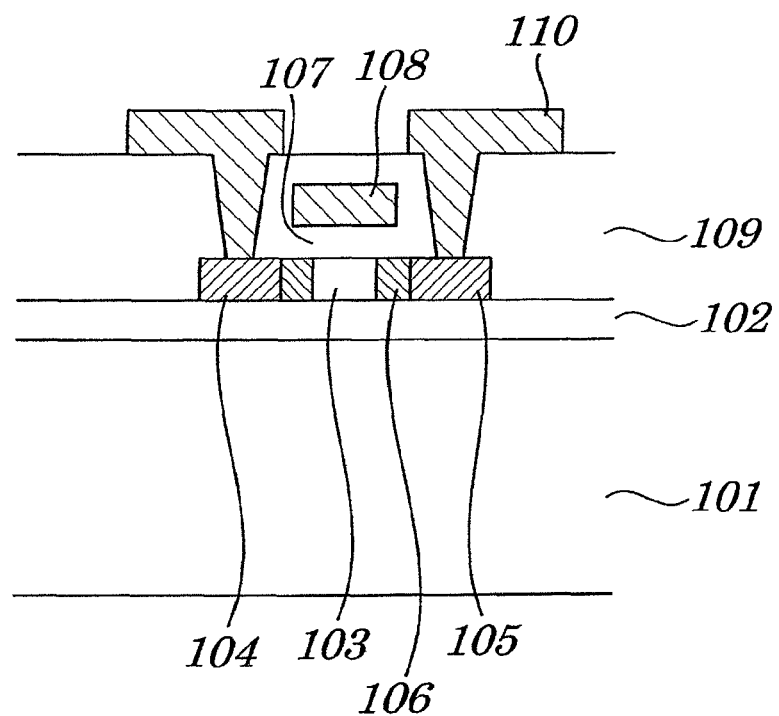
FIG. 17 is a diagram illustrating a general and typical structure of a conventional TFT.

Next, as shown in FIG. 16G and FIG. 16G', after interlayer separation insulating films T7 and T7' have been deposited, a contact hole is formed and then a metal film for wiring is deposited. Then, a metal wiring T8 is formed by photolithography and etching technology. The process of forming the contact hole is performed by photolithography and etching technology.

By performing processes as above, the conventional TFT to be compared as a reference is completed.

It is apparent that the present invention is not limited to the above embodiments but may be changed and modified without departing from the scope and spirit of the invention.

What is claimed is:

1. A semiconductor thin film, comprising:
    a semiconductor thin film layer configured to receive an energy beam in a light-shielded region and grow a crystal in a pre-defined direction with the light-shielded region as a starting point, wherein a first thickness of the starting point from which the crystal is grown is less than a second thickness of a terminating point of crystal growth.

2. The semiconductor thin film of claim 1, wherein the light-shielded region is formed by a light-shielding pattern above the semiconductor thin film layer, and a ratio of a pitch of the light-shielding pattern to a light-shielding width of the light-shielding pattern is at least one.

3. The semiconductor thin film of claim 2, wherein the light-shielding width of the light-shielding pattern is at least 0.3 μm.

4. The semiconductor thin film of claim 1, wherein the semiconductor thin film layer includes silicon and has a thickness of about 60 μm.

5. The semiconductor thin film of claim 1, wherein a temperature gradient in the light-shielded region is at least 300° C./μm.

6. The semiconductor thin film of claim 5, wherein the semiconductor thin film layer is configured to grow the crystal in a first direction of the temperature gradient and at least partially inhibit growth of the crystal in a second direction orthogonal to the temperature gradient.

7. A thin film transistor, comprising:
    a gate electrode;
    a thin film layer; and
    a gate insulating film interposed between the gate electrode and the thin film layer, wherein the gate insulating film is configured to receive an energy beam and generate a light shielded region in the thin film layer, and wherein the thin film layer is configured to grow a crystal in a pre-defined direction, away from or perpendicular to the gate electrode, with the light-shielded region as a starting point.

8. The thin film transistor of claim 7, wherein a thickness of the starting point from which the crystal is grown is smaller than a thickness of a terminating point of crystal growth.

9. The thin film transistor of claim 7, wherein the semiconductor thin film layer includes silicon and has a thickness of about 75 μm.

10. The thin film transistor of claim 7, wherein a local temperature gradient in the light-shielded region is at least 300° C./μm.

11. The thin film transistor of claim 7, wherein the semiconductor thin film layer is configured to grow the crystal in a direction of a width of the gate electrode.

12. The thin film transistor of claim 7, wherein the gate electrode has a width of at least 0.3 μm.

13. An apparatus, comprising:
    an irradiation device configured to apply an energy beam to a semiconductor thin film to create a temperature gradient in a light-shielded region of at least 300° C./μm, and cause a crystal to grow in a pre-defined direction with the light-shielded region of the semiconductor thin film as a starting point.

14. The apparatus of claim 13, wherein the irradiation device includes a projection exposure unit configured to apply the energy beam with a single pulse of irradiation and cause an area of the semiconductor thin film to concurrently melt and re-crystallize.

15. The apparatus of claim 13, wherein the irradiation device includes an optical system with a resolution of 4 μm or less.

16. The apparatus of claim 13, wherein the irradiation device is configured to apply the energy beam to the light-shielded region with an intensity gradient of at least 220 mJ/cm2/μm.

17. The apparatus of claim 13, wherein the irradiation device is further configured to cause the crystal to grow in a first direction of the temperature gradient and at least partially inhibit growth of the crystal in a second direction orthogonal to the temperature gradient.

18. The semiconductor thin film of claim 2, wherein the semiconductor thin film layer is configured to grow the crystal in a direction defined by a width of the light-shielding pattern.

19. The semiconductor thin film of claim 2, wherein the semiconductor thin film layer is configured to grow the crystal in a direction perpendicular to the width of the light-shielding pattern.

20. The apparatus of claim 13, wherein a first thickness of the starting point from which the crystal is grown is less than a second thickness of a terminating point of growth of the crystal.

* * * * *